(12) United States Patent
Mastantuono et al.

(10) Patent No.: US 10,326,410 B2
(45) Date of Patent: *Jun. 18, 2019

(54) AMPLIFIER ADAPTED FOR NOISE SUPPRESSION

(71) Applicant: Telefonaktiebolaget LM Ericsson (publ), Stockholm (SE)

(72) Inventors: Daniele Mastantuono, Lund (SE); Sven Mattisson, Bjärred (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 15/730,133

(22) Filed: Oct. 11, 2017

(65) Prior Publication Data

US 2018/0034420 A1  Feb. 1, 2018

Related U.S. Application Data

(63) Continuation of application No. 14/913,466, filed as application No. PCT/EP2015/055454 on Mar. 16, 2015, now Pat. No. 9,806,677.

(51) Int. Cl.

| | | |
|---|---|---|
| *H03F 3/45* | (2006.01) | |
| *H03F 1/26* | (2006.01) | |
| *H03F 1/32* | (2006.01) | |
| *H03F 3/193* | (2006.01) | |
| *H03F 1/02* | (2006.01) | |
| *H03F 1/48* | (2006.01) | |
| *H03F 3/60* | (2006.01) | |
| *H04B 1/12* | (2006.01) | |

(52) U.S. Cl.
CPC ............ *H03F 1/26* (2013.01); *H03F 1/0205* (2013.01); *H03F 1/3211* (2013.01); *H03F 1/483* (2013.01);

(Continued)

(58) Field of Classification Search
CPC ............... H03F 3/19; H03F 3/45; H03F 3/189
(Continued)

(56) References Cited

U.S. PATENT DOCUMENTS

| | | | |
|---|---|---|---|
| 4,390,848 A | 6/1983 | Blauschild | |
| 9,806,677 B2 * | 10/2017 | Mastantuono | .......... H03F 1/483 |

(Continued)

OTHER PUBLICATIONS

Gul Han, H. et al., "A CMOS RF Programmable-Gain Amplifier for Digital TV With a +9-dBm IIP3 Cross-Coupled Common-Gate LNA", IEEE Transactions on Circuits and Systems, Express Briefs, vol. 59, No. 9, Sep. 1, 2012, pp. 543-547, IEEE.

(Continued)

*Primary Examiner* — Steven J Mottola

(74) *Attorney, Agent, or Firm* — Coats & Bennett, PLLC

(57) ABSTRACT

Systems and methods of noise suppression by an amplifier are presented. In one exemplary embodiment, an amplifier comprises first and fourth transistors configured as a first differential pair of transistors in a common-gate configuration, and second and third transistors configured as a second differential pair of transistors in a common-source configuration. The first and fourth transistors are operative to receive, from a differential input, by a source of each first and fourth transistor, a differential input signal. Further, a drain of each first and fourth transistor is coupled to respective first and second outputs configured as a differential output. The second and third transistors are operative to output, from a drain of each second and third transistor, to the respective second and first outputs, a differential output signal. Further, a gate of each second and third transistor is coupled to the respective first and second inputs.

19 Claims, 5 Drawing Sheets

(52) U.S. Cl.
CPC ......... H03F 3/193 (2013.01); H03F 3/45179 (2013.01); H03F 3/607 (2013.01); *H03F 2200/06* (2013.01); *H03F 2200/294* (2013.01); *H03F 2200/333* (2013.01); *H03F 2200/451* (2013.01); *H03F 2203/45306* (2013.01); *H03F 2203/45318* (2013.01); *H04B 1/12* (2013.01)

(58) Field of Classification Search
USPC .......................................... 330/253, 254, 301
See application file for complete search history.

(56) References Cited

U.S. PATENT DOCUMENTS

| | | |
|---|---|---|
| 2002/0050861 A1 | 5/2002 | Nguyen et al. |
| 2010/0041316 A1 | 2/2010 | Ojo |
| 2012/0007676 A1 | 1/2012 | Lee et al. |
| 2013/0278337 A1 | 10/2013 | Chou et al. |

OTHER PUBLICATIONS

Sansen, W., "Analog Design Essentials", The Springer International Series in Engineering and Computer Science, vol. 859, Jan. 1, 2006, pp. 580-595, Springer.

Jussila, J. et al., "A 1.2-V Highly Linear Balanced Noise-Cancelling LNA in 0.13-μm CMOS", IEEE Journal of Solid-State Circuits, vol. 43, No. 3, Mar. 1, 2008, pp. 579-587, IEEE.

Zare Fatin, G. H. et al., "A technique for improving gain and noise figure of common-gate wideband LNAs", Analog Integrated Circuits and Signal Processing, vol. 65 Issue 2, Nov. 1, 2010, pp. 239-244, Springer.

Kim, T-S. et al., "Post-Linearization of Differential CMOS Low Noise Amplifier Using Cross-Coupled FETs", Journal of Semiconductor Technology and Science, vol. 8, No, 4, Dec. 1, 2008, pp. 283-288, IEEE.

* cited by examiner

AMPLIFIER ADAPTED FOR NOISE SUPPRESSION

CROSS REFERENCE TO RELATED APPLICATIONS

This application is a continuation of U.S. patent application Ser. No. 14/913,466, filed Feb. 22, 2016, which is the National Stage of PCT/EP2015/055454, filed Mar. 16, 2015, all of which the contents are hereby incorporated by reference as if fully set forth below.

FIELD OF THE DISCLOSURE

The present disclosure relates to an amplifier adapted for noise suppression, a receiving apparatus comprising the amplifier, and a wireless communication apparatus comprising the receiving apparatus.

BACKGROUND

Future wireless communication networks, and in particular fifth generation networks, will require a large capacity, and this will necessitate a large communication bandwidth. Consequently, receivers for use in such networks will be required to operate at high frequency with low noise and low power consumption. A key element of a receiver is a low noise amplifier (LNA), located between an antenna and a down-conversion mixer. Therefore, there is a requirement for an improved amplifier.

In "A 1.2-V Highly Linear Balanced Noise-Cancelling LNA in 0.13-um CMOS", Jarkko Jussila and Pete Sivonen, IEEE Journal of Solid-State Circuits, Vol. 43, No. 3, March 2008 ("Jussila et al"), a noise-cancelling LNA is disclosed that employs a technique referred to as a current-to-voltage combiner. FIG. 1, which is reproduced from Jussila et al, illustrates a scheme in which output currents of common-gate (CG) and common-source (CS) field effect transistors (FETs) are converted to voltages, and the voltages are summed.

SUMMARY

According to a first aspect there is provided an amplifier adapted for noise suppression, comprising:
a first input for receiving a first input signal and a second input for receiving a second input signal, the first and second input signals constituting a differential pair;
a first output for delivering a first output signal and a second output for delivering a second output signal, the first and second output signals constituting a differential pair;
 a first transistor having a first drain coupled to the first output such that all signal current, except parasitic losses, flowing through the first drain flows through the first output, and the first transistor further having a first source coupled to the first input;
 a second transistor having a second gate coupled to the first input, a second drain coupled to the second output such that all signal current, except parasitic losses, flowing through the second drain flows through the second output, and the second transistor further having a second source coupled to a first voltage rail;
 a third transistor having a third gate coupled to the second input, a third drain coupled to the first output such that all signal current, except parasitic losses, flowing through the third drain flows through the first output, and the third transistor further having a third source coupled to the first voltage rail;
 a fourth transistor having a fourth drain coupled to the second output such that all signal current, except parasitic losses, flowing through the fourth drain flows through the second output, and the fourth transistor further having a fourth source coupled to the second input;
 a first load coupled between the first output and a second voltage rail;
 a second load coupled between the second output and the second voltage rail;
 a first inductive element coupled between the first input and a third voltage rail; and
 a second inductive element coupled between the second input and the third voltage rail;
 wherein transconductance of the first transistor is substantially equal to transconductance of the fourth transistor, within ±5%; and
 wherein transconductance of the second transistor is substantially equal to transconductance of the third transistor, within ±5%.

The amplifier may, therefore, perform at least partial noise cancellation, also referred to herein as noise suppression, on a balanced, or differential, signal. The terms "noise cancellation" and "noise suppression", or more concisely "cancellation" and "suppression", are used herein to apply to noise generated within the amplifier, and not to noise or distortion present in the first and second input signals applied at the first and second inputs. The noise may be cancelled by summing currents of the first and third transistors at the first output, and currents of the second and fourth transistors at the second output. The amplifier is advantageous in providing cancellation that can be independent of output impedance of the amplifier, the cancellation instead being dependent on the ratio of transconductance of the first and second transistors and on the ratio of transconductance of the third and fourth transistors. Consequently, the amplifier may provide improved flexibility when designing a receiving apparatus incorporating the amplifier, enabling a wide bandwidth and low power consumption.

In some embodiments, the first transistor may have a first gate coupled to a bias voltage rail and the fourth transistor may have a fourth gate coupled to the bias voltage rail. This feature enables a low complexity. In other embodiments, the first transistor may have a first gate coupled to the second input and the fourth transistor may have a fourth gate coupled to the first input. This feature enables reduced power consumption.

The transconductance of the first transistor may be equal to the transconductance of the fourth transistor, and the transconductance of the second transistor may be equal to the transconductance of the third transistor. This feature enables a higher degree of noise cancellation.

In some embodiments, the transconductance of the second transistor may be equal to the transconductance of the first transistor, and the transconductance of the third transistor may be equal to the transconductance of the fourth transistor. This feature enables a high degree of noise cancellation.

In other embodiments, the transconductance of the second transistor may exceed the transconductance of the first transistor and the transconductance of the third transistor may exceed the transconductance of the fourth transistor. This feature enables the amplifier to have a low noise factor.

For example, the transconductance of the second transistor may be less than five times the transconductance of the first transistor, and the transconductance of the third transistor may be less than five times the transconductance of the fourth transistor. This feature enables a wide bandwidth. In particular, the transconductance of the second transistor may be twice the transconductance of the first transistor, and the transconductance of the third transistor may be twice the transconductance of the fourth transistor. This feature provides a useful trade-off between noise cancellation and a wide bandwidth. In other embodiments, the transconductance of the second transistor may be three times the transconductance of the first transistor, and the transconductance of the third transistor may be three times the transconductance of the fourth transistor. This feature provides another useful trade-off between noise cancellation and a wide bandwidth.

In a preferred embodiment, the transconductance of the first transistor may be 0.02 siemens. This feature enables good matching to typical antennas.

According to a second aspect there is provided a receiving apparatus comprising the amplifier according to the first aspect.

The receiving apparatus may comprise a balun and a mixer, wherein the first input and the second input are coupled to a differential output of the balun, and the first output and the second output are coupled to a differential input of the mixer. In such a receiving apparatus the amplifier is arranged to function as a low noise amplifier (LNA).

The receiving apparatus may also comprise an antenna coupled to a single-ended input of the balun.

According to a third aspect, there is provided a wireless communication device comprising the receiving apparatus according to the second aspect.

Preferred embodiments are described, by way of example only, with reference to the accompanying drawings.

DETAILED DESCRIPTION

Figure 2:
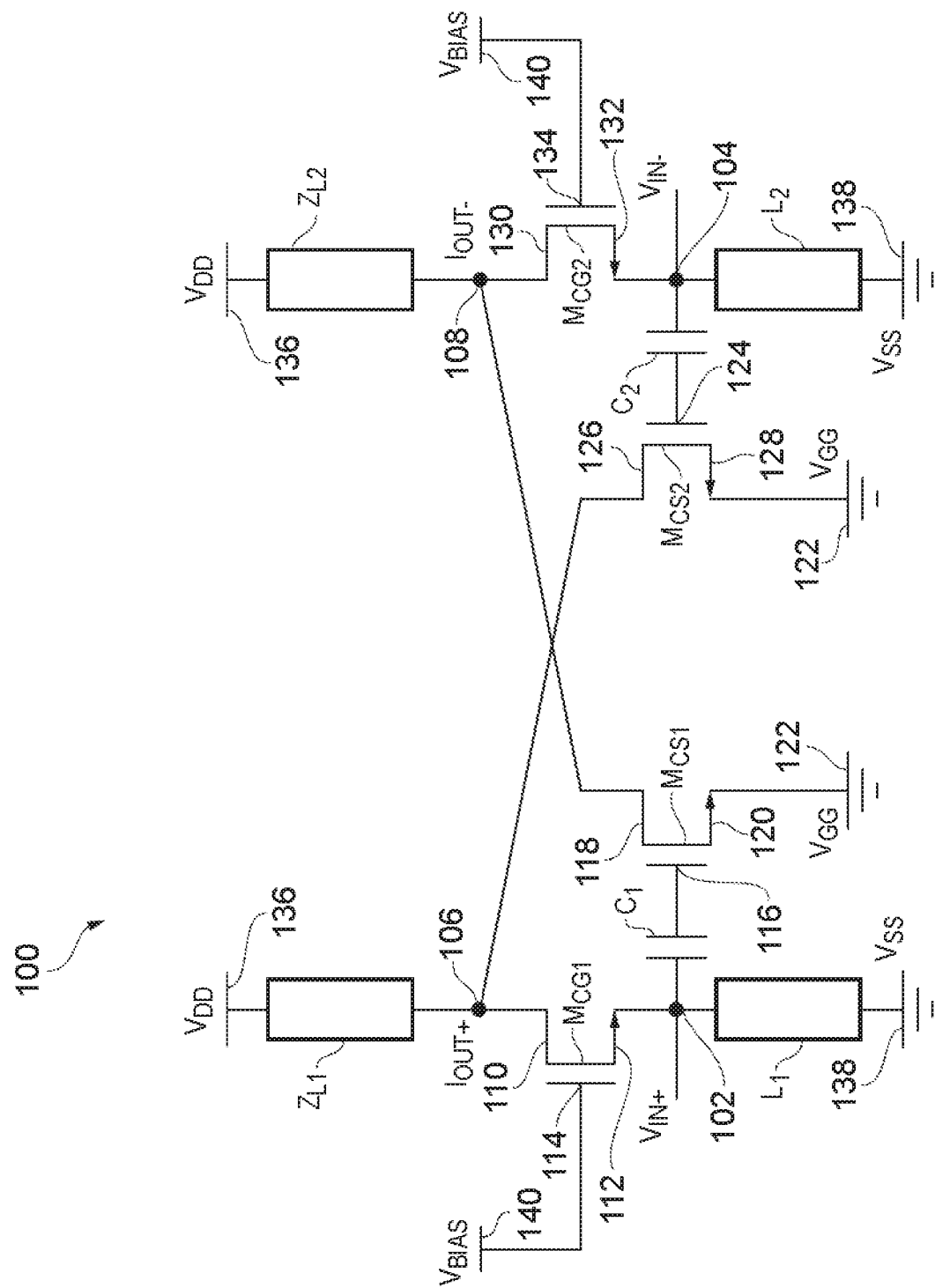
FIG. 2 is a schematic diagram of a first embodiment of an amplifier adapted for noise suppression.

Referring to FIG. 2, an amplifier 100 adapted for noise suppression comprises a first input 102 for receiving a first input signal $V_{IN+}$ and a second input 104 for receiving a second input signal $V_{IN-}$. The first and second input signals $V_{IN+}$, $V_{IN-}$ constitute a balanced pair, or differential pair, also commonly known as a differential signal. Therefore, the second input signal $V_{IN-}$ is equal to an inversion of the first input signal $V_{IN+}$. The amplifier 100 has a first output 106 for delivering a first output signal $I_{OUT+}$ and a second output 108 for delivering a second output signal $I_{OUT-}$. The first and second output signals $I_{OUT+}$, $I_{OUT-}$ together form a balanced pair, or differential pair, being constituent signals of a differential output signal $I_{OUT+}$, and therefore the second output signal $I_{OUT-}$ is equal to an inversion of the first output signal $I_{OUT+}$.

A first transistor $M_{CG1}$ is arranged in a common-gate configuration, having a drain 110 coupled to the first output 106, a source 112 coupled to the first input 102, and a gate 114 coupled to a bias voltage rail 140 supplying a bias voltage $V_{BIAS}$. The drain 110, source 112 and gate 114 of the first transistor $M_{CG1}$ alternatively may be referred to as, respectively, a first drain 110, a first source 112 and a first gate 114, for conciseness. The first drain 110 may be coupled directly to the first output 106, that is, without any intervening element having resistance, capacitance or inductance, apart from parasitic resistance, capacitance or inductance, or alternatively such an intervening element may be present. Nevertheless, the first drain 110 is coupled to the first output 106 such that that all signal current, except parasitic losses, flowing through the first drain 110 flows through the first output 106. The term "signal current" means current flowing due to either or both of the first input signal $V_{IN+}$ and the second input signal $V_{IN-}$, and excludes biasing current.

A second transistor $M_{CS1}$ is arranged in a common-source configuration, having a gate 116 coupled to the first input 102 by means of a first capacitive element $C_1$, a drain 118 coupled to the second output 108, and a source 120 coupled to a first voltage rail 122 supplying a first supply voltage $V_{GG}$, which may be at a ground potential. In other embodiments the first capacitor $C_1$ may be omitted, with the gate 116 of the second transistor $M_{CS1}$ being coupled directly to the first input 102. The drain 118, source 120 and gate 116 of the second transistor $M_{CS1}$ may alternatively be referred to as, respectively, a second drain 118, a second source 120 and a second gate 116. The second drain 118 may be coupled directly to the second output 108, or alternatively an intervening element may be present. Nevertheless, the second drain 118 is coupled to the second output 108 such that all signal current, except parasitic losses, flowing through the second drain 118 flows through the second output 108.

A third transistor $M_{CS2}$, also arranged in a common-source configuration, has a gate 124 coupled to the second input 104 by means of a second capacitive element $C_2$, a drain 126 coupled to the first output 106, and a source 128 coupled to the first voltage rail 122. In other embodiments the second capacitor $C_2$ may be omitted, with the gate 124 of the third transistor $M_{CS2}$ being coupled directly to the second input 104. The drain 126, source 128 and gate 124 of the third transistor $M_{CS2}$ may alternatively be referred to as, respectively, a third drain 126, a third source 128 and a third gate 124. The third drain 126 may be coupled directly to the first output 106, or alternatively an intervening element may be present. However, the third drain 126 is coupled to the first output 106 such that all signal current, except parasitic losses, flowing through the third drain 126 flows through the first output 106.

A fourth transistor $M_{CG2}$ arranged in a common-gate configuration has a drain 130 coupled to the second output 108, a source 132 coupled to the second input 104, and a gate 134 coupled to the bias voltage rail 140. The drain 130, source 132 and gate 134 of the fourth transistor $M_{CG2}$ may alternatively be referred to as, respectively, a fourth drain 130, a fourth source 132 and a fourth gate 134. The fourth drain 130 may be coupled directly to the second output 108, or alternatively an intervening element may be present. Nevertheless, the fourth drain 130 is coupled to the second output 108 such that all signal current, except parasitic losses, flowing through the fourth drain 130 flows through the second output 108.

A first load $Z_{L1}$ is coupled between the first output 106 and a second voltage rail 136 supplying a second supply voltage $V_{DD}$. A second load $Z_{L2}$ is coupled between the second output 108 and the second voltage rail 136. The first load $Z_{L1}$ and the second load $Z_{L2}$ have equal impedance, denoted $Z_L$, which, as explained further below, may be selected to provide the amplifier 100 with optimum output impedance for matching to an external output device coupled to the first and second outputs 106, 108.

A first inductive element $L_1$ is coupled between the first input 102 and a third voltage rail 138 supplying a third supply voltage $V_{SS}$, which may be the same as the first supply voltage $V_{GG}$. A second inductive element $L_2$ is coupled between the second input 104 and the third voltage rail 138. The first inductive element $L_1$ and the second inductive element $L_2$ have equal inductance, denoted L. The first and second inductive elements $L_1$, $L_2$ may be selected to provide a low impedance direct current (DC) path to the third voltage rail 138, thereby maximizing the voltage headroom available to the first and fourth transistors $M_{CG1}$, $M_{CG2}$, thereby enabling low voltage operation, and at a radio frequency (RF), their inductance L may be selected either to cancel parasitic capacitance, or to be sufficiently large that their contribution to input impedance of the amplifier 100 is small.

The fourth transistor $M_{CG2}$ may be a duplicate of the first transistor $M_{CG1}$. In particular, transconductance of the first transistor $M_{CG1}$, denoted $g_{m1}$, is preferably equal to transconductance of the fourth transistor $M_{CG}$, denoted $g_{m4}$. However, in practice the transconductance $g_{m1}$ of the first transistor $M_{CG1}$ may be typically within ±5% of transconductance $g_{m4}$ of the fourth transistor $M_{CG}$. Similarly, the third transistor $M_{CS2}$ may be a duplicate of the second transistor $M_{CS1}$. In particular, transconductance of the second transistor $M_{CS1}$, denoted $g_{m2}$, is preferably equal to transconductance of the third transistor $M_{CS2}$, denoted $g_{m3}$. However, in practice the transconductance $g_{m2}$ of the second transistor $M_{CS1}$ may be typically within ±5% of the transconductance $g_{m3}$ of the third transistor $M_{CS2}$.

Assuming that fourth transistor $M_{CG2}$ is a duplicate of the first transistor $M_{CG1}$, and that the third transistor $M_{CS2}$ is a duplicate of the second transistor $M_{CS1}$, and therefore that $g_{m1}=g_{m4}=g_{m,CG}$ and $g_{m2}=g_{m3}=g_{m,CS}$, the input impedance $Z_{IN}$ of each of the first and second inputs 102, 104 of the amplifier 100 can be expressed as $$Z_{IN}=1/g_{m,CG} \quad (1)$$

The differential input impedance between the first and second inputs 102, 104 is therefore $Z_{IN}=2/g_{m,CG}$. Typically, the single-ended input impedance $Z_{IN}$ is required to be 50Ω, or the differential input impedance is required to be 100Ω, for optimum matching to an external input device, such as a passive balun for matching the first and second inputs 102, 104 of the amplifier 100 to an antenna without reflection of signals, in which case the transconductance $g_{m,CG}$ of the first and fourth transistors $M_{CG1}$, $M_{CG2}$ is arranged to be 0.02 S (0.2 siemens).

The differential voltage gain A of the amplifier 100 can be expressed as $$A=2g_{m,CG}(1+\beta)Z_L \quad (2)$$

where $\beta=g_{m,CS}/g_{m,CG}$.

The noise factor F, also known as noise figure, of the amplifier 100 can be expressed as $$F = 1 + \frac{(\beta-1)^2}{(\beta+1)^2}\gamma + \frac{4\beta}{(\beta+1)^2}\gamma + \frac{8}{A(\beta+1)} \quad (3)$$

where γ is a parameter dependent on the technology used, and is typically considered to be 1. By coupling the third drain 126 of the third transistor $M_{CS2}$ directly to the first output 106 such that all current, except parasitic losses, flowing through the third drain 126 flows through the first output 106, and the second drain 118 of the second transistor $M_{CS1}$ to the second output 108 such that all current, except parasitic losses, flowing through the second drain 118 flows through the second output 108, the currents at the first and second outputs 106, 108 are sensed. Assuming that $V_{IN+}=-V_{IN-}=V_{IN}$, that the fourth transistor $M_{CG2}$ is a duplicate of the first transistor $M_{CG1}$, and that the third transistor $M_{CS2}$ is a duplicate of the second transistor $M_{CS1}$, and therefore that $I_{OUT+}=I_{OUT-}=I_{OUT}$, the differential transconductance gain of the amplifier 100, can be expressed as $$\frac{I_{OUT}}{V_{IN}} = 2(g_{mCG}+g_{mCS}) = 2g_{mCG}(1+\beta) \quad (4)$$

If β=1, the noise of the common-gate first and fourth transistors $M_{CG1}$, $M_{CG2}$, which is represented by the second term in equation (3), is completely cancelled. This condition, therefore, may be considered to correspond to optimum cancellation. If β≠1, noise cancellation takes place, but is partial, that is, incomplete or non-optimum.

Figure 3:
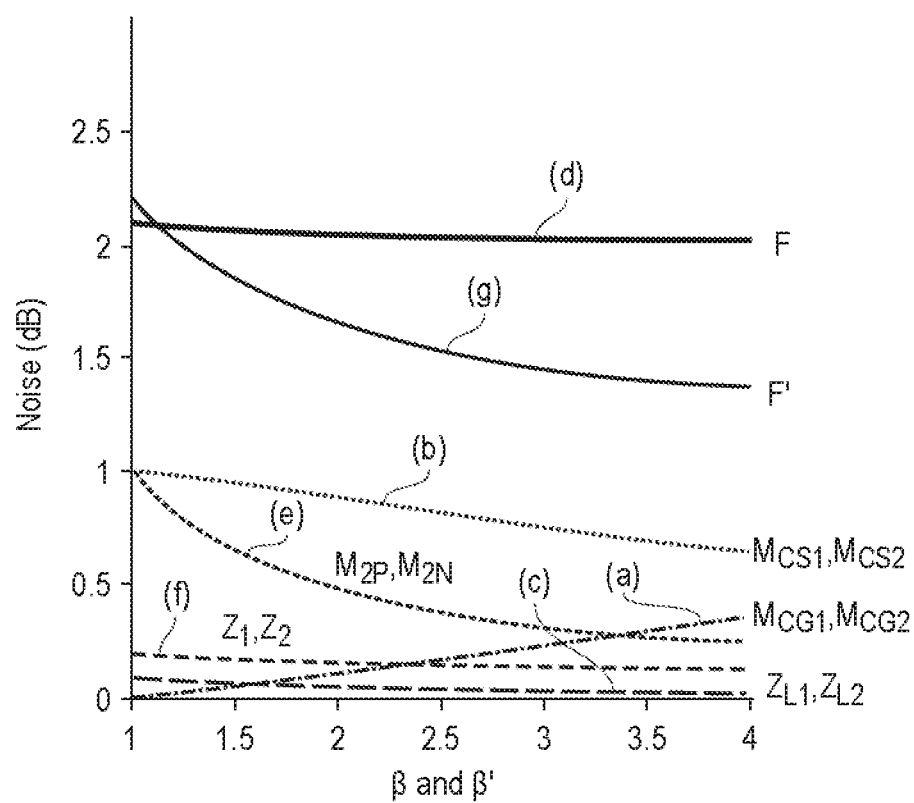
FIG. 3 is a graph illustrating the noise contribution of elements.

Referring to FIG. 3, there is plotted, as a function of β, from β=1 to β=4, and for γ=1, $g_{m,CG}$=0.02 S and $Z_L$=500Ω the noise contribution to the noise factor F of the amplifier 100 of, in curve (a), the first and fourth transistors $M_{CG1}$, $M_{CG2}$, in curve (b), the second and third transistors $M_{CS1}$, $M_{CS2}$, and, in curve (c), the first and second loads $Z_{L1}$, $Z_{L2}$ in combination. The overall noise factor F, being the sum of these noise contributions, is plotted in curve (d). It can be seen from FIG. 3 that the noise contribution of the first and fourth transistors $M_{CG1}$, $M_{CG2}$ increases for β>1, that is, $g_{m,CS}>g_{m,CG}$. However, the noise contribution of the second and third transistors $M_{CS1}$, $M_{CS2}$ and of the first and second loads $Z_{L1}$, $Z_{L2}$ decreases as β increases above unity, with the result that the total noise decreases as β increases from one to four. Moreover, by employing β>1 for partial noise cancellation, it can be seen from equation (4) that the differential transconductance gain of the amplifier 100 is higher than if 13=1 for optimum noise cancellation. Therefore, by employing β>1 the amplifier 100 has a lower noise and a higher gain than possible if the amplifier 100 is operated with β=1 for optimum noise cancellation, whilst enabling the input impedance $Z_{IN}$ to be selected for optimum matching. The use of a high value of β can reduce the bandwidth of the amplifier 100, so in some embodiments a trade-off between lower noise, higher gain and reduced bandwidth may be made by selecting β to be greater than unity but less than, for example, 2, 3 or 5.

Therefore, in the amplifier 100, the transconductance $g_{m2}$ of the second transistor $M_{CS1}$ may exceed the transconductance $g_{m1}$ of the first transistor $M_{CG1}$ and likewise the transconductance $g_{m3}$ of the third transistor $M_{CS2}$ may exceed the transconductance $g_{m4}$ of the fourth transistor $M_{CG2}$. However, in some embodiments, the transconductance $g_{m2}$ of the second transistor $M_{CS1}$ may be less than five times the transconductance $g_{m1}$ of the first transistor $M_{CG1}$, and in particular may be twice, or three times, the transconductance $g_{m1}$ of the first transistor $M_{CG1}$. Likewise, in some embodiments, the transconductance $g_{m3}$ of the third transistor $M_{CS2}$ may be less than five times the transconductance $g_{m4}$ of the fourth transistor $M_{CG2}$, and in particular may be twice, or three times, the transconductance $g_{m4}$ of the fourth transistor $M_{CG2}$. In one preferred embodiment, the transconductance $g_{m1}$ of the first transistor $M_{CG1}$ is 0.02 S.

The impedance $Z_L$ of the first and second loads $Z_{L1}$, $Z_{L2}$ impacts the absolute noise level in the amplifier 100, but has no impact on the noise cancellation, and therefore may be selected to be high to reduce the noise level, and to drive an external output device coupled to the first and second outputs 106, 108. Typically, such an external output device would be a mixer, and in particular a passive mixer, for down-converting an RF signal to baseband, and the matching should ensure a high bandwidth and a high linearity. The first and second loads $Z_{L1}$, $Z_{L2}$ typically may be selected to provide very high impedance, for example at least 500Ω, and may be implemented, for example, using a current generator.

Figure 4:
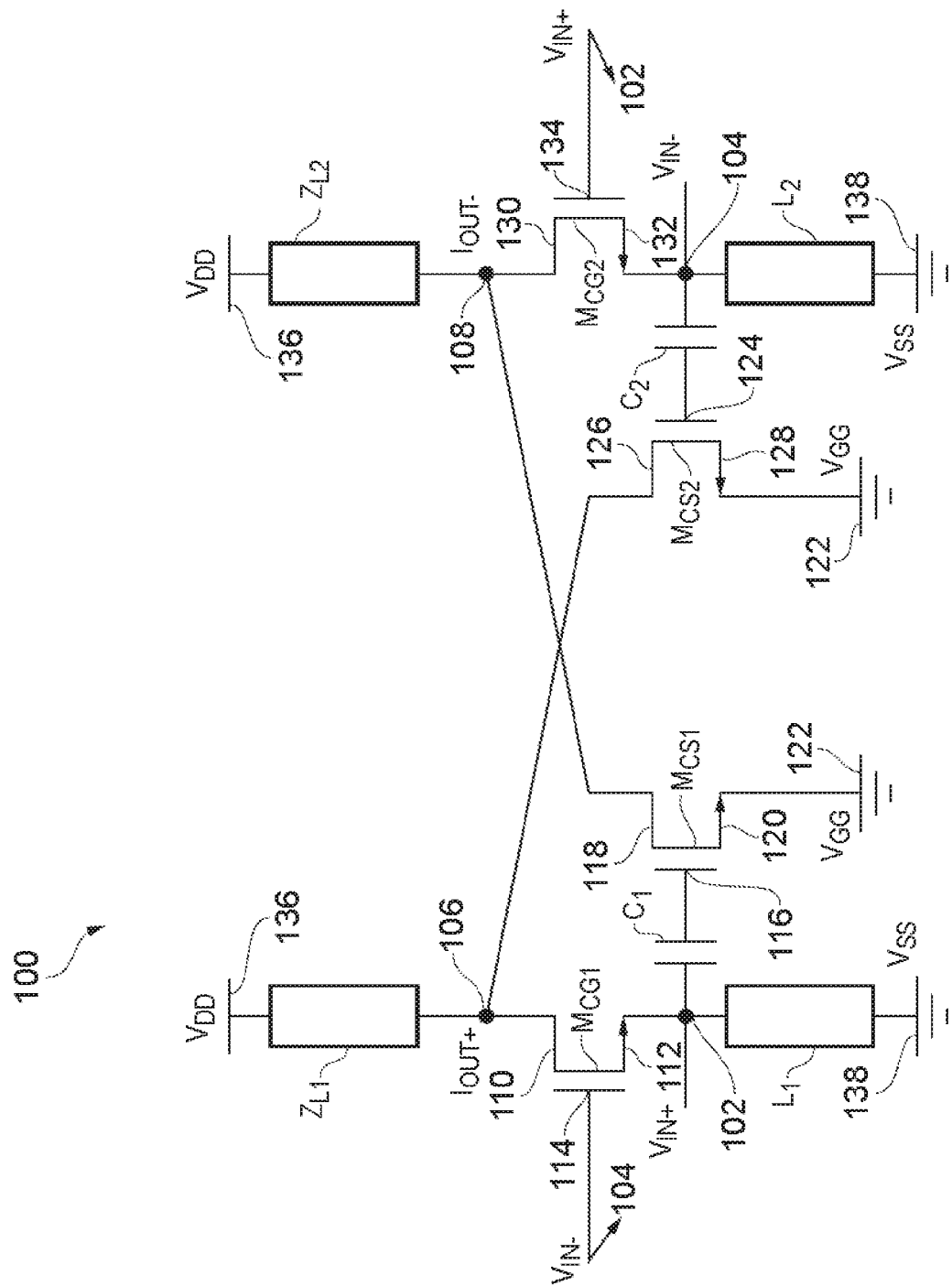
FIG. 4 is a schematic diagram of a second embodiment of an amplifier adapted for noise suppression.

Referring to FIG. 4, an alternative embodiment of the amplifier 100 adapted for noise suppression has a topology identical to the topology of the embodiment described with reference to FIG. 2, except that instead of the first and fourth gates 114, 134 being coupled to the bias voltage rail 140, the first gate 114 is coupled to the second input 104, and the fourth gate 134 is coupled to the first input 102. Such cross-coupling of the first and fourth transistors $M_{CG1}$, $M_{CG2}$ can reduce the current required for providing a desired input impedance of the amplifier 100, thereby reducing power consumption, although this may increase capacitance at the first and second inputs 102, 104, thereby reducing bandwidth of the amplifier 100.

In the following paragraphs, some key differences in operation between the amplifier 100 disclosed herein and the noise-cancelling LNA illustrated in FIG. 1 and disclosed by Jussila et al are described, in order to highlight advantages of the amplifier 100.

The amplifier 100 disclosed herein sums the current of the common-gate first transistor $M_{CG1}$ and the common-source third transistor $M_{CS2}$ at the first output 106, and sums the current of the common-gate fourth transistor $M_{CG2}$ and the common-source second transistor $M_{CS1}$ at the second output 108. In contrast, referring to FIG. 1, a consequence of the different topology (compared with the amplifier 100 in FIG. 2) of the load circuit comprising the impedances $Z_1$ and $Z_2$ and its coupling to common-gate and common-source transistors $M_{1P}$ and $M_{2P}$, and the corresponding topology for common-gate and common-source transistors $M_{N1}$ and $M_{N2}$, is that output currents of the common-gate and common-source transistors $M_{1P}$ and $M_{2P}$, and $M_{N1}$ and $M_{N2}$, are not summed at the outputs, but instead are summed at internal nodes of the load circuits, in particular at the junction between the impedances $Z_1$ and $Z_2$ on the left side of FIG. 1, and at the corresponding junction on the right side of FIG. 1.

Figure 1:
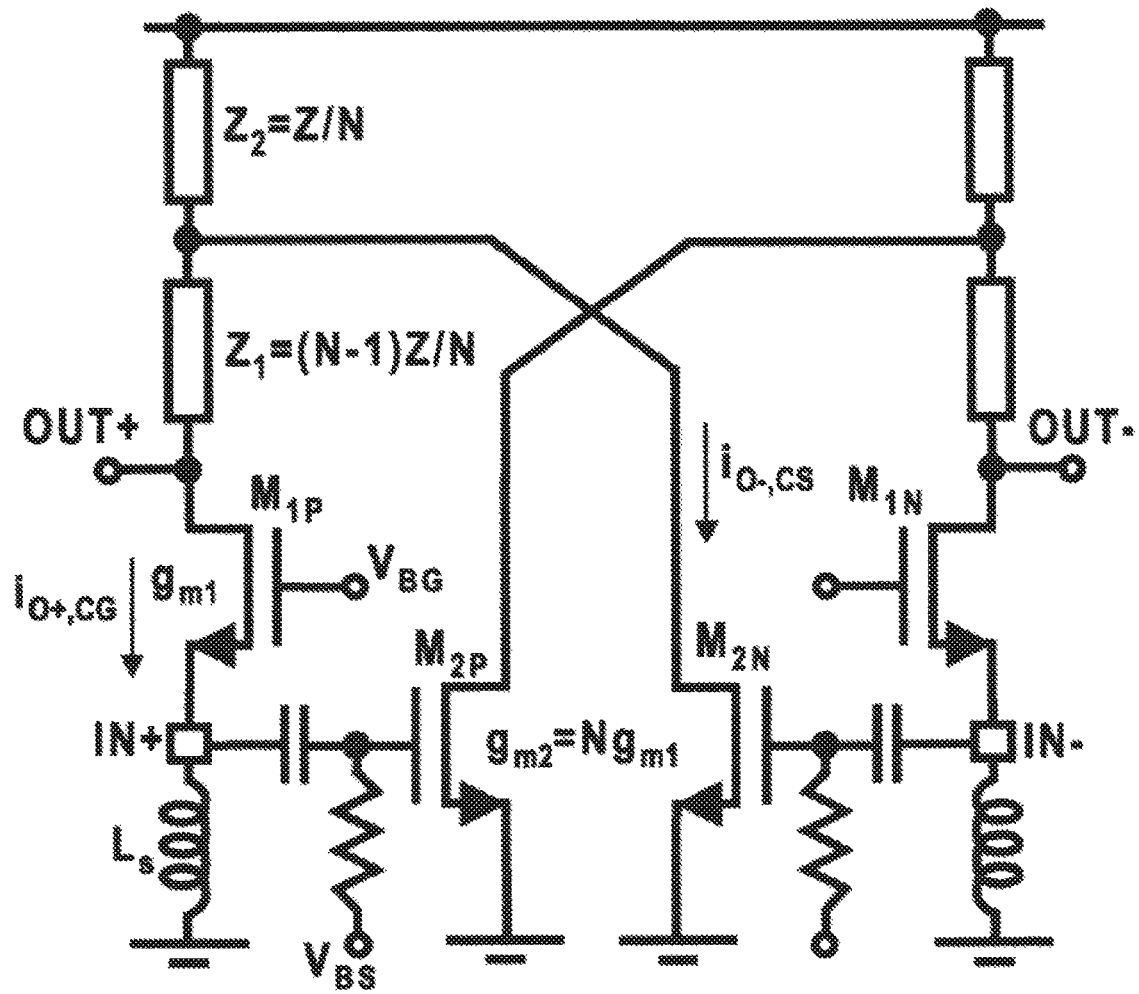
FIG. 1 is a schematic diagram of a prior art noise-cancelling low noise amplifier.

The differential voltage gain of the noise-cancelling LNA of FIG. 1 is $A'=2g_{m1}(Z_1+Z_2)$, and the differential transconductance gain is $g_{m1}$, where $g_{m1}$ is the transconductance of the common-gate transistor $M_{1P}$ and of the common-gate transistor $M_{1N}$. Typically, to assure input matching, an input impedance of 50Ω is required, which can be provided by selecting $g_{m1}=0.02$ S. By selecting high values for the impedances $Z_1$ and $Z_2$, the differential voltage gain A' can be high and the noise contribution of the impedances $Z_1$ and $Z_2$ can be low, but the differential transconductance gain, equal to $g_{m1}$, is constrained by the requirement for input matching. In contrast, as can be seen from equations (2) and (4), the differential voltage gain A and the differential transconductance gain $I_{OUT}/V_{IN}$ of the amplifier 100 can be increased due the presence of the parameter β in equations (2) and (4), and by increasing the parameter β. This design flexibility of the amplifier 100 simplifies the design of apparatus incorporating the amplifier 100.

In the noise-cancelling LNA of FIG. 1, because the noise cancellation takes place in the voltage domain, the degree of noise cancellation will be affected if the output of the LNA is loaded by being coupled to a low impedance device, for example a broadband passive current mixer. In contrast, in the amplifier 100 the first and second loads $Z_{L1}$, $Z_{L2}$ do not affect the noise cancellation of the amplifier 100, so may be freely selected for optimum output matching. Again, this design flexibility of the amplifier 100 simplifies the design of apparatus incorporating the amplifier 100.

The noise factor F' of the noise-cancelling LNA of FIG. 1 may be expressed as $$F' = 1 + \frac{\gamma}{\beta'} + \frac{2}{A'} + \frac{2}{A'\beta'} \quad (5)$$

where β' is the ratio $g_{m2}/g_{m1}$ of transconductance $g_{m2}$ of the common-source transistor $M_{2P}$ to the transconductance $g_{m1}$ of the common-gate transistor $M_{1P}$. Likewise, β' is also the ratio of transconductance of the common-source transistor $M_{2N}$ to the transconductance of the common-gate transistor $M_{1N}$. Therefore, γ/β' in equation (5) is the noise of the common-source transistors $M_{2P}$, $M_{2N}$. For the purpose of comparison, it is herein assumed that β'=β. The term 2/A' represents the noise of the load impedance $Z_1+Z_2$ of the common-gate transistors $M_{1P}$, $M_{1N}$, and the term 2/A'β' represents the noise of the load impedance $Z_2$ of the common-source transistors $M_{2P}$, $M_{2N}$.

Referring to FIG. 3, there is plotted, for the noise-cancelling LNA of FIG. 1, the noise contribution of the common-source transistors $M_{2P}$, $M_{2N}$ in curve (e), the noise contribution of the load impedances $Z_1$, $Z_2$ in combination in curve (f), and the overall noise factor F', being the sum of these noise contributions, in curve (g), for differential voltage gain A'=20 and for γ'=1. The noise factor F of the amplifier 100 is higher than the noise factor F' of the noise-cancelling LNA of FIG. 1 for values of β and β' exceeding about 1.25, but the amplifier 100 has the advantages described above of greater design flexibility and higher differential transconductance gain.

Figure 5:
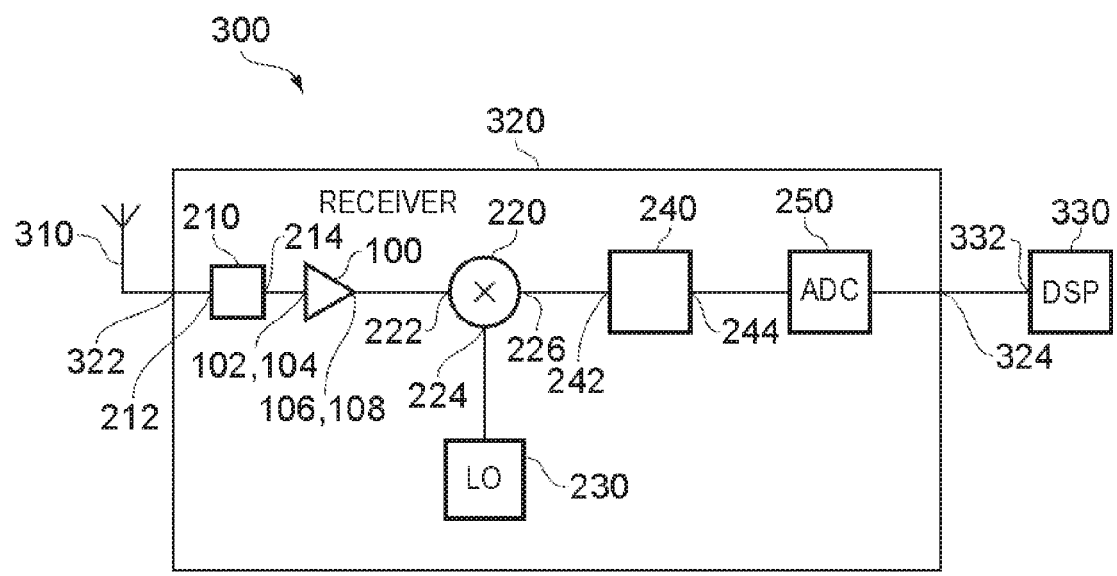
FIG. 5 is a block schematic diagram of a receiving apparatus.

Referring to FIG. 5, a receiving apparatus 300 comprises an antenna 310 coupled to an input 322 of a receiver 320. An output 324 of the receiver 320 is coupled to an input 332 of a digital signal processor (DSP) 330. The receiver 320 comprises a balun 210 for converting a single ended received signal from the antenna 310 to the first and second input signals $V_{IN+}$, $V_{IN-}$ forming a differential, or balanced, signal. The receiver 320 also comprises the amplifier 100 for amplifying the first and second input signals $V_{IN+}$, $V_{IN-}$, a mixer 220, a local oscillator signal generator (LO) 230, a filter 240, and an analogue to digital converter (ADC) 250. The balun 210 has an input 212 coupled to the input 322 of the receiver 320, and a differential output 214 for delivering the first and second input signals $V_{IN+}$, $V_{IN-}$. The first and second input 102, 104 of the amplifier 100 are coupled to the output 214 of the balun 210. The first and second outputs 106, 108 of the amplifier 100 are coupled to a first differential input 222 of the mixer 220. Therefore, in the receiver 320 the amplifier 100 is arranged to operate as an LNA. The local oscillator signal generator (LO) 230 is coupled to a second input 224, which may be differential, of the mixer 220 for delivering a local oscillator signal. The mixer 220, which may be, for example, a passive mixer, down-converts the received signal after amplification by the amplifier 100, and delivers a down-converted signal at an output 226 of the mixer 220. The output 226 of the mixer 220 is coupled to an input 242 of the filter 240 for filtering the down-converted signal, and an output 244 of the filter 240 is coupled to the output 324 of the receiver 320 by means of the ADC 250. After digitisation of the down-converted and filtered signal in the ADC 250, the digitised signal is processed by the DSP 330 to extract information conveyed by the received signal.

Figure 6:
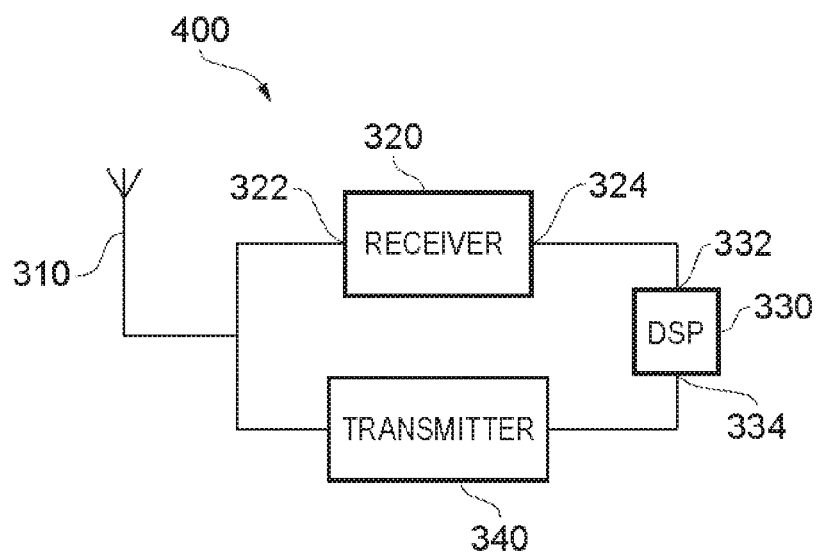
FIG. 6 is a block schematic diagram of a wireless communication device.

Referring to FIG. 6, a wireless communication apparatus 400 comprises the elements of the receiving apparatus 300 described with reference to FIG. 5, and additionally comprises a transmitter 340 coupled between an output 334 of the DSP 330 and the antenna 310 for transmitting a signal generated by the DSP 330.

Although wireless communication has been used as an example, the invention also has application in other fields of communication, for example optical fibre communication or communication via wire.

Other variations and modifications will be apparent to the skilled person. Such variations and modifications may involve equivalent and other features that are already known and which may be used instead of, or in addition to, features described herein.

Features that are described in the context of separate embodiments may be provided in combination in a single embodiment. Conversely, features that are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that where a component is described as being "arranged to" or "adapted to" perform a particular function, it may be appropriate to consider the component as merely suitable "for" performing the function, depending on the context in which the component is being considered. Throughout the text, these terms are generally considered as interchangeable, unless the particular context dictates otherwise. It should also be noted that the Figures are not necessarily to scale; emphasis instead generally being placed upon illustrating the principles of the present invention.

The invention claimed is:

1. An amplifier adapted for noise suppression, comprising:
   first and fourth transistors configured as a first differential pair of transistors operative to receive, from first and second inputs configured as a differential input, by a source of each respective first and fourth transistor, a differential input signal, with a drain of each first and fourth transistor coupled to respective first and second outputs configured as a differential output;
   second and third transistors configured as a second differential pair of transistors in a common-source configuration and operative to output, from a drain of each respective second and third transistor, to the respective second and first outputs, a differential output signal, with a gate of each second and third transistor coupled to the respective first and second inputs; and
   wherein a transconductance of each second and third transistor exceeds a transconductance of the respective first and fourth transistors.

2. The amplifier of claim 1, wherein the drain of each first and fourth transistor is coupled to the respective first and second outputs so that all signal current, except parasitic losses, flowing through those drains flow through the respective first and second outputs.

3. The amplifier of claim 1, wherein the drain of each second and third transistor is coupled to the respective second and first outputs so that all signal current, except parasitic losses, flowing through those drains flow through the respective second and first outputs.

4. The amplifier of claim 1, wherein:
   a first load is coupled between the first output and a second voltage rail;
   a second load is coupled between the second output and the second voltage rail;
   a first inductive element is coupled between the first input and a third voltage rail; and
   a second inductive element is coupled between the second input and the third voltage rail.

5. The amplifier of claim 1, wherein:
   transconductance of the first transistor is substantially equal to transconductance of the fourth transistor within ±5%; and
   transconductance of the second transistor is substantially equal to transconductance of the third transistor within ±5%.

6. The amplifier of claim 1, wherein the gate of each first and fourth transistor is coupled to a bias voltage rail.

7. The amplifier of claim 1, wherein the gate of each first and fourth transistor is coupled to the respective second and first input.

8. The amplifier of claim 1, wherein the transconductance of each second and third transistor is no more than five times the transconductance of the respective first and fourth transistors.

9. The amplifier of claim 1, wherein the transconductance of each second and third transistor is equal to two times the transconductance of the respective first and fourth transistors.

10. The amplifier of claim 1, wherein the transconductance of each second and third transistor is equal to three times the transconductance of the respective first and fourth transistors.

11. The amplifier of claim 1, wherein the transconductance of each first and fourth transistor is 0.02 siemens.

12. The amplifier of claim 1, wherein the differential input signal is a differential input voltage and the differential output signal is a differential output current.

13. A receiving apparatus adapted for noise suppression, comprising:
   an amplifier, comprising:
      first and fourth transistors configured as a first differential pair of transistors operative to receive, from first and second inputs configured as a differential input, by a source of each respective first and fourth transistor, a differential input signal, with a drain of each first and fourth transistor coupled to respective first and second outputs configured as a differential output;
      second and third transistors configured as a second differential pair of transistors in a common-source configuration and operative to output, from a drain of each respective second and third transistor, to the respective second and first outputs, a differential output signal, with a gate of each second and third transistor coupled to the respective first and second inputs; and wherein a transconductance of each second and third transistor exceeds a transconductance of the respective first and fourth transistors.

14. The receiving apparatus of claim 13, further comprising:
a balun with the first and second inputs coupled to a differential output of the balun; and
a mixer with the first and second outputs coupled to a differential input of the mixer.

15. The receiving apparatus of claim 14, further comprising an antenna coupled to a single-ended input of the balun.

16. A mobile communication device adapted for noise suppression, comprising
a receiving apparatus having an amplifier, the amplifier comprising:
first and fourth transistors configured as a first differential pair of transistors operative to receive, a differential input, by a source of each respective first and fourth transistor, respective first and second input signals, collectively being a differential input signal, with a drain of each first and fourth transistor coupled to respective first and second outputs configured as a differential output;
second and third transistors configured as a second differential pair of transistors in a common-source configuration and operative to output, from a drain of each respective second and third transistor, to the respective second and first outputs, a differential output signal, with a gate of each second and third transistor coupled to the respective first and second inputs; and
wherein a transconductance of each second and third transistor exceeds a transconductance of the respective first and fourth transistors.

17. The amplifier of claim 16, wherein the amplifier is an amplifier whose differential input voltage produces a differential output current.

18. The amplifier of claim 16, wherein the amplifier is configured as a low noise amplifier (LNA) of a radio frequency (RF) receiver.

19. A method performed by an amplifier for suppressing noise, the amplifier having first and second inputs configured as a differential input, first and second outputs configured as a differential output, first and fourth transistors configured as a first differential pair of transistors, and second and third transistors configured as a second differential pair of transistors in a common-source configuration, comprising:
receiving, from the first and second inputs, by a source of each respective first and fourth transistor, a differential input signal, with a drain of each first and fourth transistor coupled to the respective first and second outputs;
outputting, from a drain of each second and third transistor, to the respective second and first outputs, a differential output signal, with a gate of each second and third transistor coupled to the respective first and second inputs; and
wherein a transconductance of each second and third transistor exceeds a transconductance of the respective first and fourth transistors.

* * * * *